United States Patent [19]

Lur et al.

[11] Patent Number: 5,464,794
[45] Date of Patent: Nov. 7, 1995

[54] METHOD OF FORMING CONTACT OPENINGS HAVING CONCAVO-CONCAVE SHAPE

[75] Inventors: Water Lur, Taipei; Jiun Y. Wu, Dou-Lio, both of Taiwan

[73] Assignee: United Microelectronics Corporation, Hsinchu, Taiwan

[21] Appl. No.: 241,005

[22] Filed: May 11, 1994

[51] Int. Cl.⁶ .................................................. H01L 21/283
[52] U.S. Cl. ........................ 437/187; 437/195; 437/981; 437/982; 437/947; 148/DIG. 161; 257/774
[58] Field of Search ...................... 437/187, 195, 437/981, 982, 947; 148/133, 161; 257/774

[56] References Cited

U.S. PATENT DOCUMENTS

| | | | |
|---|---|---|---|
| 4,812,419 | 3/1989 | Lee et al. | 437/203 |
| 5,356,834 | 10/1994 | Sugimoto et al. | 148/DIG. 133 |
| 5,364,817 | 11/1994 | Luv et al. | 437/982 |
| 5,368,682 | 11/1994 | Park | 437/981 |

Primary Examiner—George Fourson
Assistant Examiner—Thomas G. Bilodeau
Attorney, Agent, or Firm—George O. Saile

[57] ABSTRACT

A new method of metallization using a new design of metal contact shape, contact/via profile, and metal lines having considerably reduced current density and improved electromigration of metal lines is achieved. Metal contacts are formed in a rectangular shape instead of a square shape with the wider side perpendicular to the current direction. Contact openings are made having concavo-concave profiles which can provide a wider conducting cross-sectional area than can conventional openings with a vertical profile near the contact bottom. Gaps are formed within wide and high current metal lines so that current density can be effectively lowered by utilizing the whole metal line uniformly.

4 Claims, 5 Drawing Sheets

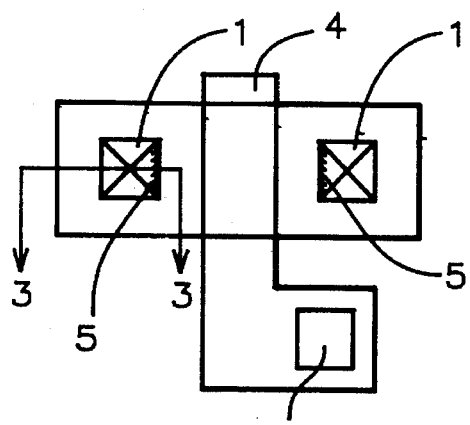
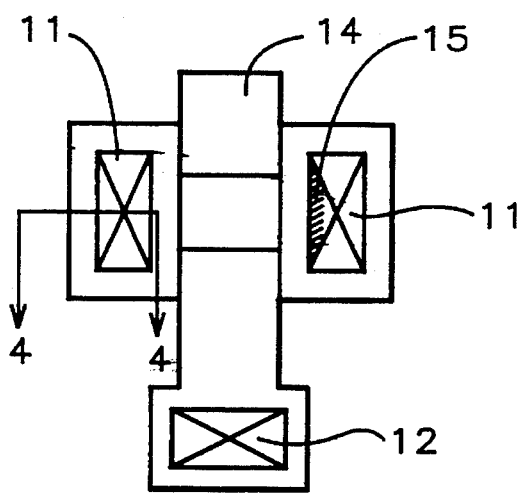
FIG. 1
Prior Art
FIG. 2
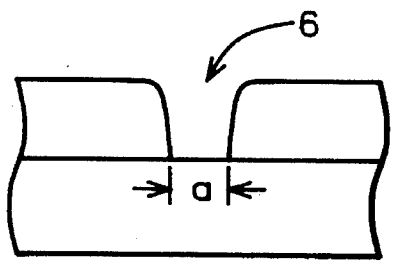
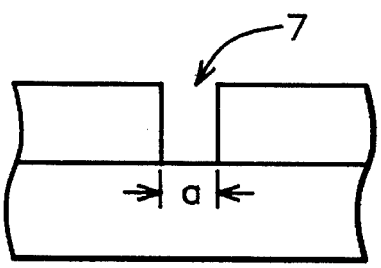
FIG. 3A
Prior Art
FIG. 3B
Prior Art
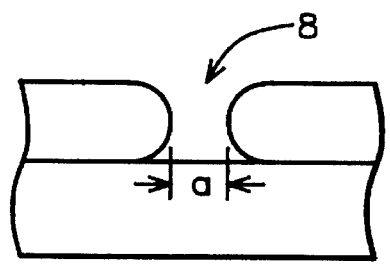
FIG. 4

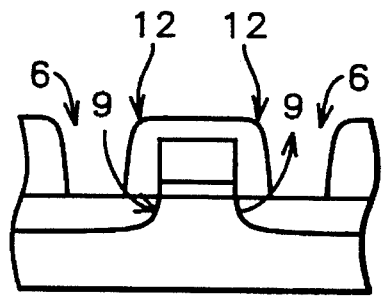
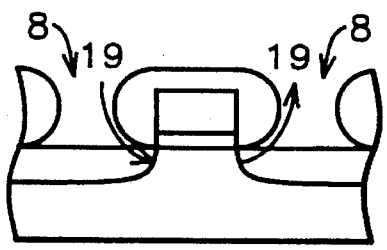
FIG. 5
Prior Art     FIG. 6
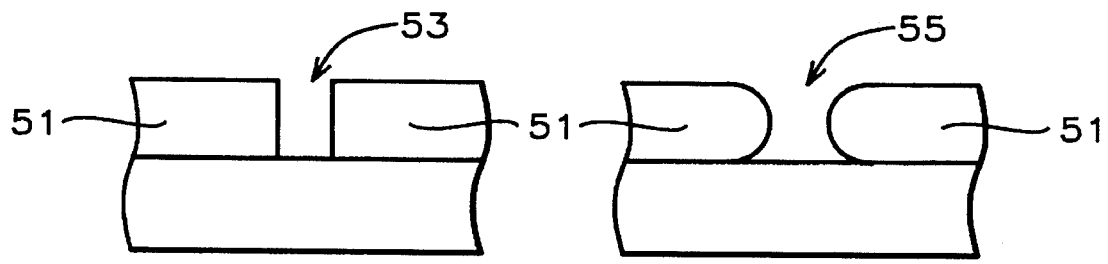
FIG. 7A     FIG. 7B

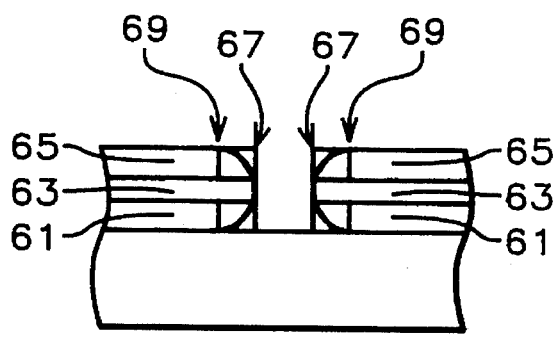
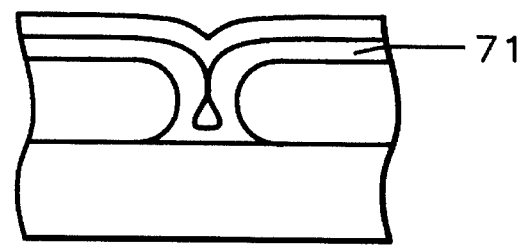
FIG. 8          FIG. 9
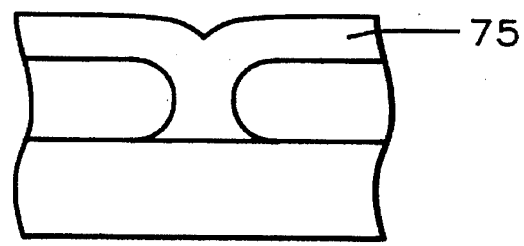
FIG. 10
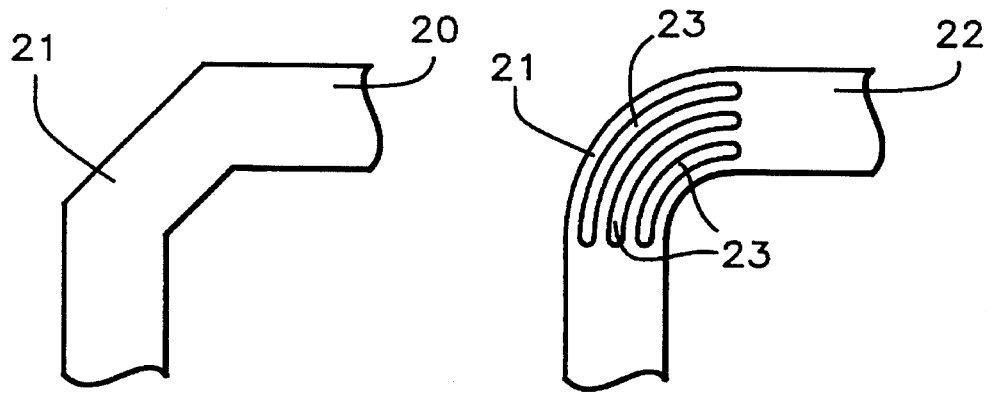
FIG. 11
Prior Art      FIG. 12

5,464,794

METHOD OF FORMING CONTACT OPENINGS HAVING CONCAVO-CONCAVE SHAPE

BACKGROUND OF THE INVENTION

1. Field of the Invention

The invention relates to a method of metallization in the fabrication of integrated circuits, and more particularly, to a method of metallization resulting in improved electromigration resistance in the manufacture of integrated circuits.

2. Description of the Prior Art

The electromigration endurance of metal lines is closely related to metal cross sectional area, the metal material, operation temperature, current density, etc. In sub half-micron devices, the metal lines have been shrunk as much as possible to reduce chip area. Therefore, high current density in metal lines becomes a major issue for electromigration resistance.

The applied voltage in devices generates an electrical field inside the conducting material as well as on the dielectric. The magnitude of the current density in the conducting material is proportional to the existing electrical field and the conductivity of the material. That is, $J=\sigma E=\sigma(-dV)$ where J=current density, E=electrical field, V=electrical potential, $\sigma$=conductivity, and d=the directional derivative.

The current density can be reduced if the electrical field is reduced. This will improve the electromigration endurance. The Mean Time to Failure (MTF) of a metal line is proportional to $J^{-n} e^{(Ea/RT)}$, where Ea is the activation energy of the metal.

U.S. Pat. No. 4,812,419 to Lee et al describes a method of using a strip of high resistivity material to line the via hole connecting two metal lines to assure more uniform current flow. However, this method does not fully solve the current density problem at the corners of metal lines.

SUMMARY OF THE INVENTION

A principal object of the present invention is to provide an effective and very manufacturable method of metallization with reduced current density and improved electromigration endurance in the fabrication of an integrated circuit.

In accordance with the objects of this invention a new method of metallization using a new design of metal contact shape, contact/via profile, and metal lines having considerably reduced current density and improved electromigration of metal lines is achieved. Metal contacts are formed in a rectangular shape instead of a square shape with the wider side perpendicular to the current direction. Contact openings are made having concavo-concave profiles which can provide a wider conducting cross-sectional area than can conventional openings with a vertical profile near the contact bottom. Gaps are formed within wide and high current metal lines so that current density can be effectively lowered by utilizing the whole metal line uniformly.

BRIEF DESCRIPTION OF THE DRAWINGS

In the accompanying drawings forming a material part of this description, there is shown:

FIG. 1 schematically illustrates in top-view contact openings of the prior art.

FIG. 2 schematically illustrates in top-view wide-contact openings of the present invention.

FIGS. 3A and 3B schematically illustrates in cross-sectional representation contact openings of the prior art.

FIG. 4 schematically illustrates in cross-sectional representation a contact opening of the present invention.

FIG. 5 schematically illustrates in cross-sectional representation the current flow through contact openings of the prior art.

FIG. 6 schematically illustrates in cross-sectional representation the current flow through contact openings of the present invention.

FIGS. 7A, 7B, and 8 schematically illustrate in cross-sectional representation methods for forming the contact profile of the present invention.

FIGS. 9 and 10 schematically illustrate in cross-sectional representation methods for filling the contact profile of the present invention.

FIG. 11 schematically illustrates a top-view of a metal line of the prior art.

FIG. 12 schematically illustrates a top-view of a metal line of the present invention.

DESCRIPTION OF THE PREFERRED EMBODIMENTS

Figure 13:
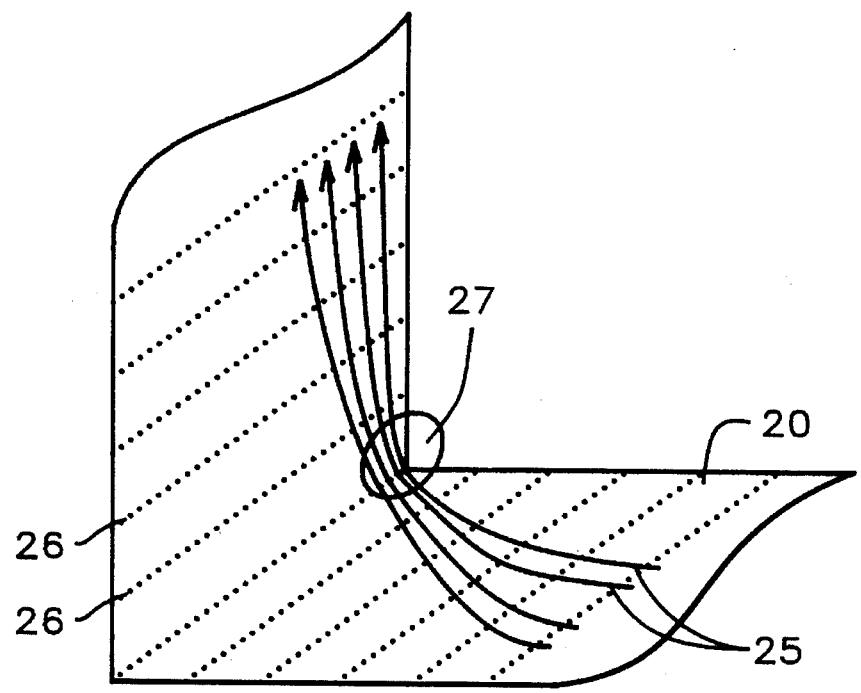
FIG. 13 schematically illustrates a top-view of a metal line showing the current crowding problem.

Referring now to FIG. 1, there is shown a top view of contacts 1 of the prior art. Contact 2 is a metal contact on polysilicon or polycide 4. Current always flows through the shortest path so the current density is corisiderably non-uniform across the whole metal line, especially where the metal line takes a turn. Current crowding 5 occurs at the edges of the contacts. FIGS. 3A and 3B illustrate two alternative contact opening profiles, view 3—3 of FIG. 1. Contact opening size a is the same in both figures. Conventional contact opening profiles have sloped sides as in 6 in FIG. 3A or vertical sides as in 7 in FIG. 3B. FIG. 5 illustrates the current flow 9 through contact openings 6. The current crowding occurs at the contact edges 12 that are adjacent to the channel.

Referring now more particularly to FIG. 2, the contact shape of the present invention will be described. Contacts 11 are wider than contacts 1 (in FIG. 1) of the prior art, so there is less current crowding 15. The contacts are formed in a rectangular shape instead of the conventional square shape. The wider side of the rectangle is perpendicular to the current direction. FIG. 4 illustrates the contact profile of the present invention. This contact opening 8 has a concavo-concave shape; that is, both sides of the opening have a concave shape. Contact opening size a is the same as in the prior art FIGS. 3A and 3B and here refers to the narrowest part of the contact opening. The current flow of the present invention in illustrated by 19 in FIG. 6. The effective current flow cross section becomes larger than the conventional profile.

The concavo-concave shape of the contact opening can be achieved in a number of ways. Two methods are discussed herein as examples. It should be understood that other methods know to those skilled in the art could be employed to achieve the concavo-concave contact shape of the present invention. In a first method, the contact opening is dry or wet by dry etched to a wider size than in the conventional scheme, as shown by 53 in FIG. 7A, followed by a thermal treatment to reflow the premetal dielectric 51, as shown in FIG. 7B, to create the concavo-concave contact opening shape 55. Typically, the premetal dielectric is composed of borosilicate glass (BSG), phosphosilicate glass (PSG), or borophosphosilicate glass (BPSG) and is easy to reflow at a temperature of about 850° C. or higher. In a second method, as shown in FIG. 8, the premetal dielectric can be formed by multi-layer structure; for example, boron and phosphorus doped tetraethoxysilane (TEOS) oxide 63 sandwiched by undoped TEOS oxide 61 and 65. Based on the different etching rates of the doped and undoped TEOS in chemical solution, the concavo-concave shape is easily achieved by a first directional dry etch to provide the vertical sides 67 followed by a wet etch which will attack the undoped TEOS 61 and 65 to provide the shape 69.

Using the contact opening profile of the invention, the metal line should be formed by filling the contact opening with chemically vapor deposited (CVD) tungsten, titanium nitride, aluminum, or the like metals. If the concavo-concave shaped contact openings are filled by CVD, it is easy to form voids within the metal stud. FIG. 9 illustrates the CVD metal 71 filling the contact opening and forming void 73. The cross-sectional area for the current flow does not shrink around the voids. Moreover, the presence of voids in refractory metals such as tungsten is favorable to stress migration endurance, but has nothing to do with the electromigration problem.

Sputtering should not be used unless the method is specifically modified. If the concavo-concave shaped contact opening is filled by a physical vapor deposition (PVD) method, such as aluminum alloy sputtering, it is better to avoid the formation of voids within the contact. There have been some mature sputtering techniques developed to satisfy this kind of requirement, such as a multistep sputtering, e.g., cold aluminum, then hot aluminum. This is illustrated in FIG. 10 where PVD aluminum 75 fills the contact opening.

FIG. 11 illustrates a wide metal line 20 of the prior art. The current crowding problem is most significant at the corner 21 of the line. Metal line 22 in FIG. 12 of the present invention, has gaps 23 incorporated into the metal line at the critical corner area 21. These gaps may be open or may be filled with silicon dioxide. The gaps act to split the current flow. As further illustrated in FIG. 13, current flow through the metal line 20 is shown by lines 25. Lines 26 are equipotential lines. The current crowding problem is most severe in region 27. The current flows in conducting material along the electrical field lines; i.e., J=σE, where J=current density, σ=conductivity, E=electrical field.

The electrical field comes from the electrical potential difference (voltage drop) between two points, i.e., E=−d V, where d=the directional derivative and V is the voltage drop. Therefore, the equipotential lines are always perpendicular to the electrical field lines.

Figure 14:
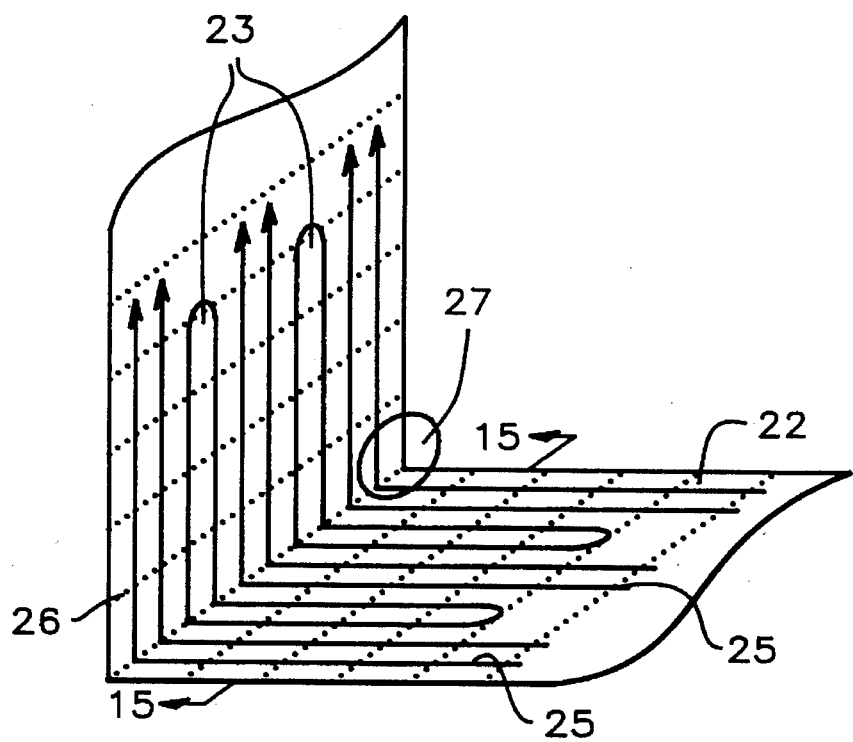
FIG. 14 schematically illustrates a top-view of a metal line of the present invention.

FIG. 14 illustrates the wide metal line 22 of the invention. Gaps 23 have been formed within the metal line in the critical corner region of the line. The current flow shown by lines 25 is split by the gaps so that the flow is uniform through the width of the line and is not concentrated at the corner as it is in the prior art. The gaps 23 should be started and ended at equipotential lines.

Figure 15:
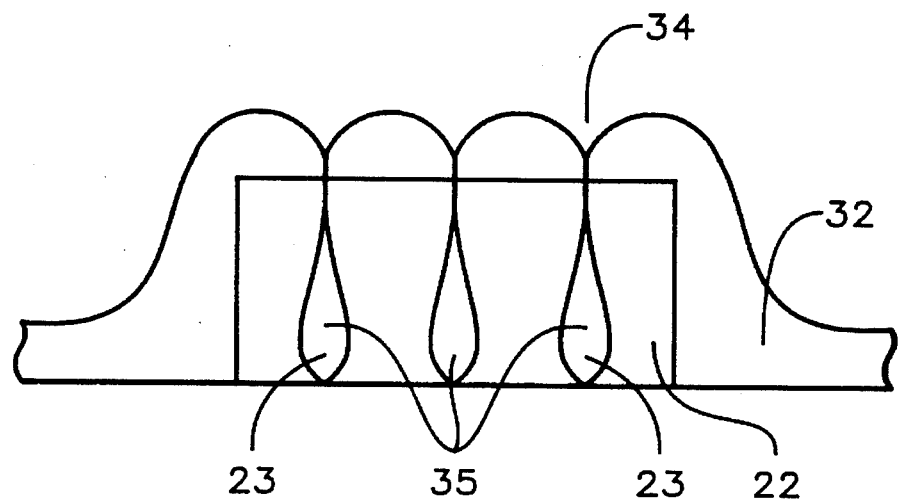
FIG. 15 schematically illustrates in cross-sectional representation the view 15—15 of FIG. 14.

FIG. 15 illustrates view 15—15 of FIG. 140 The corner region of wide metal line 22 is shown. The gaps 23 are formed by the modification of the metal layer mask. The magnitude of gapping can be minimized by the critical photolithography limitation; that is, about 0.5 microns or less in an eximer laser or X-ray lithography. FIG. 15 shows the intermetal dielectric layer 32. The gaps 23 may be left open or may be filled with silicon dioxide. After dielectric deposition, the filling 34 in the gaps 23 may produce some voids 35. These voids help to release system stress. Whether the gaps are filled or left open, they serve the purpose of splitting the current flow so that it is uniform throughout the width of the metal line, especially at the corners of the line.

Figure 16:
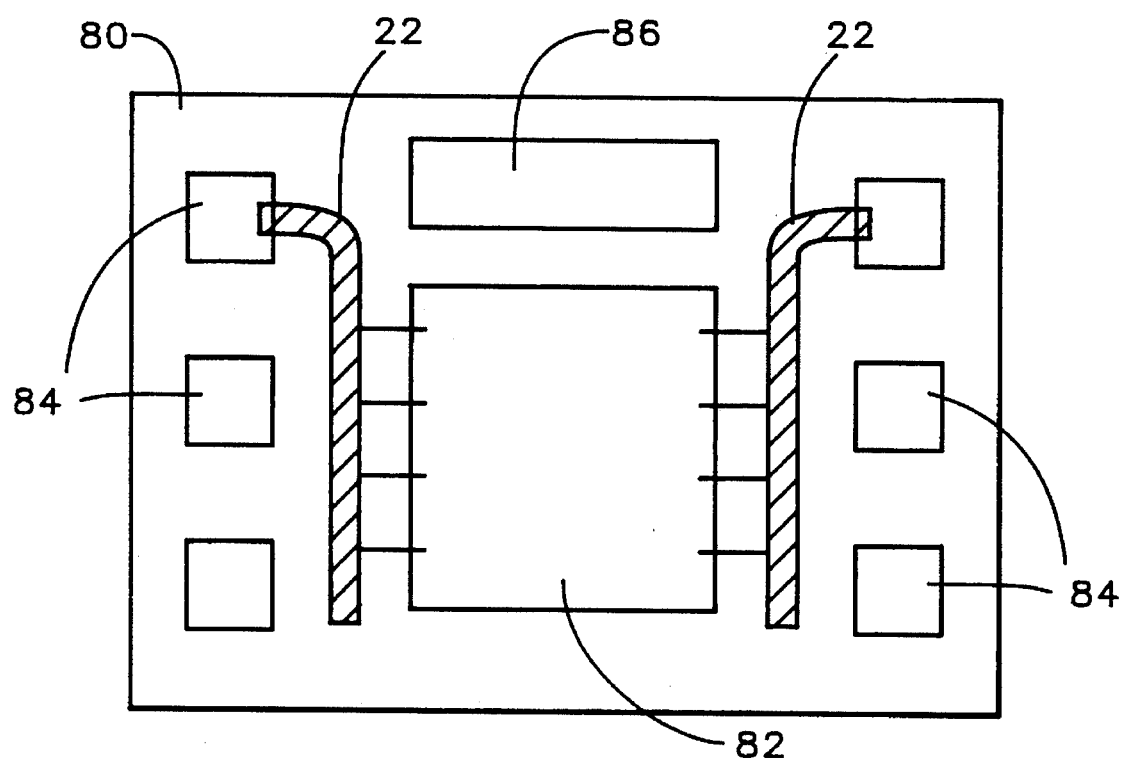
FIG. 16 schematically illustrates a top-view of an integrated circuit chip of the present invention.

The wide metal lines are usually designed for power supply or grounding as well as protection guard rings to provide enough current flow and are typically located at the periphery of the integrated circuit chip. These wide metal lines 22 are shown in FIG. 16. FIG. 16 represents a semiconductor chip 80. The memory cells 82 are located in the central area of the chip. Input/output (I/O) pads 84 and other peripheral circuits 86 are arranged around the periphery of the chip. The wider the metal line 22, the larger is its cross-sectional area. The electromigration is related to the current density which is inversely proportional to the metal cross-sectional area. Narrow metal lines within the central area 82 of the chip have low current flow and hence the electromigration effect is minor.

While the invention has been particularly shown and described with reference to the preferred embodiments thereof, it will be understood by those skilled in the art that various changes in form and details may be made without departing from the spirit and scope of the invention.

What is claimed is:

1. A method of forming contact openings having concavo-concave profiles in the fabrication of an integrated circuit comprising:

providing a glasseous premetal dielectric layer over the surface of a semiconductor substrate;

etching said contact openings through said glasseous premetal dielectric layer wherein said contact openings have vertical sidewalls and are of a first width;

reflowing said glasseous premetal dielectric layer to transform each said vertical sidewall to a concave shape wherein said contact opening will have a concavoconcave shape and wherein the width of said opening at the narrowest point will be of a second width less than said first width and wherein the bottom of said opening has a width equal to the first width and filling said contact opening with conductive material.

2. The method of claim 1 wherein said glasseous premetal dielectric layer is composed of borosilicate glass without phosphorus.

3. The method of claim 1 wherein said glasseous premetal dielectric layer is composed of borophosphosilicate glass.

4. The method of claim 1 wherein said glasseous premetal dielectric layer is composed of phosphosilicate.

* * * * *